United States Patent [19]

Poston et al.

[11] Patent Number: 4,518,947

[45] Date of Patent: May 21, 1985

[54] APPARATUS FOR DECODING REDUNDANT INTERLEAVED DATA

[75] Inventors: Billy R. Poston, St. Petersburg; Carl F. Andren, Indiatlantic, both of Fla.

[73] Assignee: E-Systems, Inc., Dallas, Tex.

[21] Appl. No.: 586,996

[22] Filed: Mar. 8, 1984

Related U.S. Application Data

[63] Continuation of Ser. No. 306,489, Sep. 28, 1981, abandoned.

[51] Int. Cl.$^3$ .................................. H03K 13/24
[52] U.S. Cl. ........................ 340/347 DD; 371/69; 364/734
[58] Field of Search ............ 340/347 DD, 347 AD; 371/6, 69; 364/734, 811; 307/464

[56] References Cited

U.S. PATENT DOCUMENTS 3,780,279 12/1973 Stover ................................ 371/69
4,132,975 1/1979 Koike ................................ 371/69

OTHER PUBLICATIONS

Kovacs, "IEEE Transactions on Instrumentation and Measurement", vol. IM-28, No. 2, Jun. 1979, pp. 152–155.

Primary Examiner—Charles D. Miller
Attorney, Agent, or Firm—Albert M. Crowder, Jr.

[57] ABSTRACT

A method and apparatus is disclosed for decoding a redundantly coded digital signal wherein each information character is coded with a plurality of signal elements. Each of the signal elements is sampled by an analog to digital converter (110) and the resulting sample value is transmitted to an adder (114). The sampled value is added to an accumulated sum which is received from a storage circuit (128). The sum of the sampled value and the accumulated sum is transmitted through a selector switch (120) to both a decision circuit (126) and the storage circuit (128). After the last of the redundantly coded signal elements is sampled and the sampled values included within the accumulation sum, the state of the information character is determined by the decision circuit (126). Switch (120) then enters a null data set to reset the accumulated sum to zero for processing the next group of redundantly coded signal elements.

4 Claims, 6 Drawing Figures

APPARATUS FOR DECODING REDUNDANT INTERLEAVED DATA

The U.S. government has rights in this invention pursuant to Contract No. F30602-78-C-0066 awarded by the Department of the Air Force.

This is a continuation of application Ser. No. 306,489 filed Sept. 28, 1981 now abandoned.

TECHNICAL FIELD

The present invention pertains to digital communication and in particular to a method and apparatus for decoding a recursively encoded information signal.

BACKGROUND OF THE INVENTION

Interleaving has heretofore been used as a technique for redundantly coding digital transmissions to avoid the effects of pulse interference by spreading the information bits over the duration of the message. One form of interleaving is to repeat the entire message a number of times in succession. When the message is received each bit is decoded in a conventional manner and the predominant state is selected as the correct state for the bit.

Redundantly coding the information bits in this manner increases the transmission bit rate over the case for non-coded bits for the same total message time length. At the higher transmission bit rate the signal-to-noise ratio for each bit is lower and consequently more errors will be made in determining the value for each bit. This transmission method, however, provides enhanced resistance to pulse interference having a short time period and an amplitude in excess of the amplitude of the signal.

The disadvantage of redundant coding is that each received bit has a very low signal-to-noise ratio. When each bit is decoded with a hard decision a substantial number of errors are produced which can lead to an unacceptably high error rate. Therefore, in order to better utilize the technique of interleaving there exists a need for a method and apparatus for decoding an interleaved signal to take maximum advantage of the redundant bits while avoiding hard errors due to erroneous decoding of individual bits.

DISCLOSURE OF THE INVENTION

A method and apparatus is provided for decoding a redundantly coded digital signal wherein each information character is encoded a plurality of times. The decoding method comprises sampling each of the coded signal elements to produce a quantitative value representing the sampled signal element. Quantitative values are summed for each of the redundantly coded signal bits representing a given information character to produce a summation value for that information character. The summation value for the information character is then compared to a reference value to determine the state of the given information character.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION

The present invention comprises a method and apparatus for decoding a redundantly coded message stream. In contrast with the prior art wherein each bit is decoded with a hard decision, the present invention decodes each bit with a soft decision and sums the soft decisons to create one information bit which is then subjected to a hard decision. If individual bits are subjected to impulse interference that creates an erroneous sample value, the overall decision process is then subjected to only a gradual degradation in signal-to-noise ratio for the resulting information bit.

Figure 1:
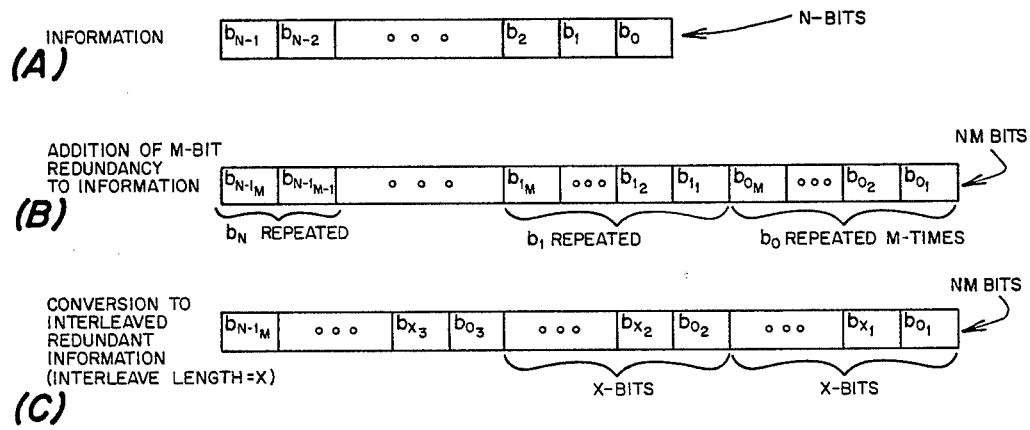
FIG. 1(A) is an information bit stream of N-bit length.
FIG. 1(B) is a redundant pattern of the bit stream shown in FIG. 1(A)
FIG. 1(C) is an interleaved redundant pattern of the bit stream shown in FIG. 1(A)

The format of a redundant interleaved information signal is shown in FIG. 1. An information stream of N bits is shown in FIG. 1(A) with the information bits being $b_0$-$b_{N-1}$. Each of the information bits is made redundant serially by a factor of M. This is illustrated in FIG. 1(B). The redundant bits are then interleaved as shown in FIG. 1(C) with an interleave length of X. In both of FIGS. 1(B) and 1(C) there are $N \times M$ bits and for FIG. 1(C) the bits are arranged in an interleaved and redundant fashion.

Figure 2:
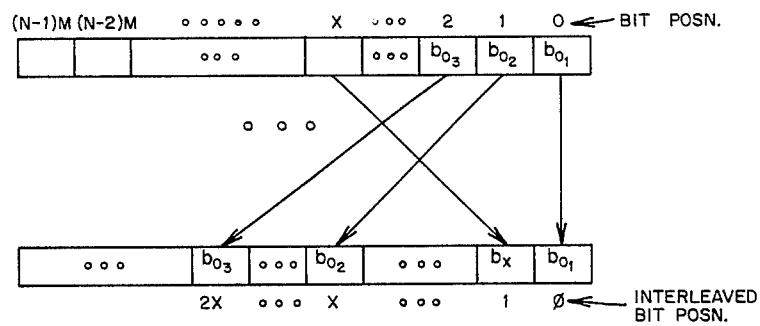
FIG. 2 is a generalization of the redundant, interleaved bit pattern shown in FIG. 1(C)

The general layout for the redundant and interleaved bit pattern described herein is shown in FIG. 2. The upper bit pattern in FIG. 2 represents the original information pattern while the lower bit pattern represents the interleaved and redundant bit pattern which comprises a series of repeated character strings. Each character string comprises a block of information bits and a full set of similar blocks comprises a complete cycle.

Figure 3:
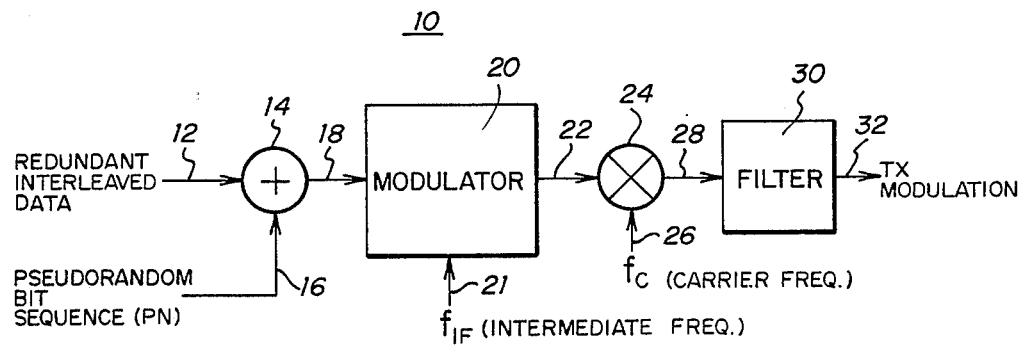
FIG. 3 is a block diagram of a modulation system.

A circuit for modulating the redundant and interleaved bit pattern as described in FIGS. 1(A)–1(C) and 2 is shown in FIG. 3. The overall modulator is shown generally by the reference numeral 10. The redundant interleaved data is transmitted through a line 12 to a modulo 2 summation circuit 14. A pseudorandom noise bit sequence (PN) digital signal is transmitted through a line 16 to the modulo 2 summer 14. The redundant interleaved bit pattern and the PN sequence are processed in a modulo 2 sum pattern to produce the modulation signal to be transmitted. This modulation signal is transmitted through a line 18 to a modulator 20.

An intermediate frequency signal is transmitted through a line 21 to the modulator 20 where it is modulated by the signal received through line 18. The modulated intermediate frequency signal is transmitted through a line 22 to a mixer 24 where the intermediate frequency signal is mixed with a carrier signal received through a line 26. The intermediate frequency signal is frequency translated by the carrier signal and the resulting signal is transmitted through a line 28 to a filter 30. The filter 30 eliminates unwanted modulation products and passes the desired signal for transmission. The signal to be transmitted is conveyed through line 32.

Figure 4:
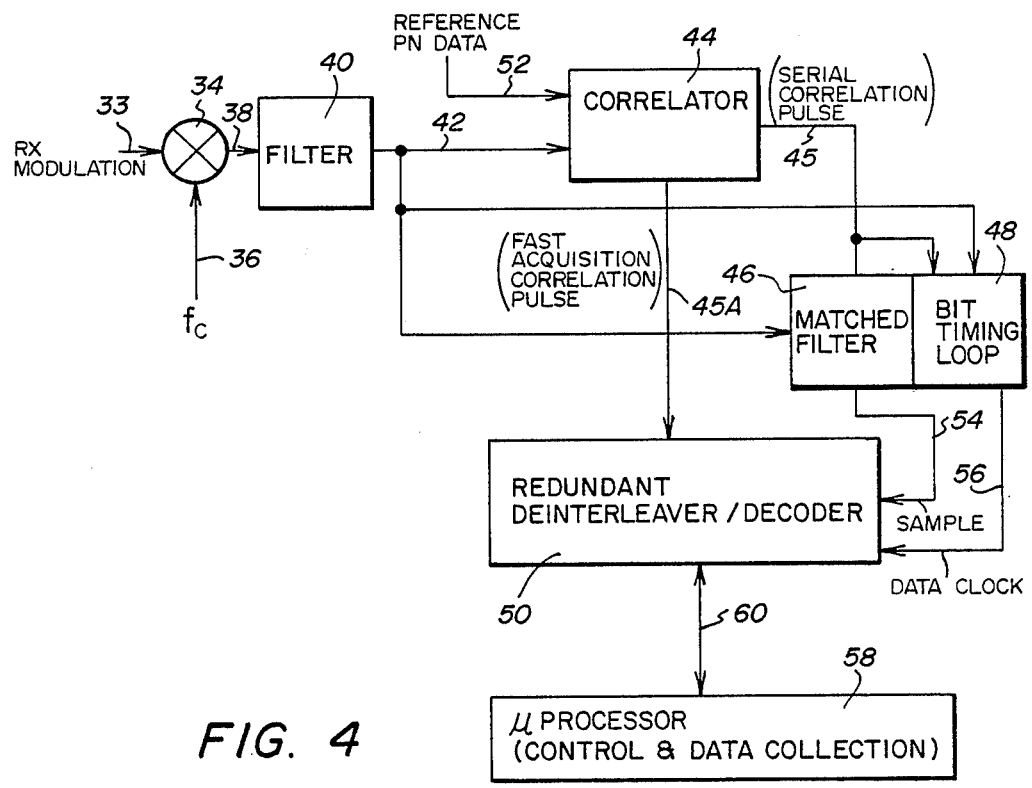
FIG. 4 is a block diagram of a demodulation system for processing the transmitted signal produced by the system shown in FIG. 3.

Referring now to FIG. 4 the transmitted signal is captured as received modulation which is provided through a line 33 to a mixer 34. The received signal is frequency translated by a means of a locally generated carrier which is provided to the mixer 34 through a line 36. The IF signal produced by the mixer 34 is transmitted through a line 38 to a filter 40.

The intermediate frequency signal derived from the filter 40 is provided through a line 42 to a correlator 44, which may alternately be a convolver, to a bit timing loop 48, a matched filter 46, and to a redundant deinterleaver/decoder 50. The decoder 50 will be described in further detail below.

The correlator 44 receives through a line 52 a reference PN data signal which corresponds to the PN signal transmitted through line 16.

The correlator 44 produces a correlation pulse as a function of the reference PN data and this correlation pulse is transmitted through a line 45 to the bit timing loop 48 and to the matched filter 46.

The matched filter 46 utilizes the correlation pulse and the IF signal received through line 42 to produce a signal which is transmitted as a sample signal through line 54.

The bit timing loop 48 utilizes the inputs thereto to produce a data clock signal on line 56 which is connected to transfer the signal sample to the decoder 50.

A microprocessor 58 is connected through a bidirectional communications path 60 to the decoder 50. Data from the received signal is transferred from the decoder 50 to the microprocessor 58 through line 60 while control information is transmitted from the microprocessor back to the decoder 50.

Referring now to FIGS. 3 and 4 for an operational description, the digital, redundant, interleaved data, as shown in FIG. 2, is combined with the PN bit sequence in summer 14 to produce a modulo 2 sum product. This product is utilized to modulate the intermediate frequency signal by operation of the modulator 20. The modulated IF is transmitted to the mixer 24 where the IF signal is mixed with the carrier signal $f_c$ to produce the modulated, transmit signal. Referring to FIG. 4, the received modulated signal is frequency down converted by the mixer 34 and then transmitted through the filter 40. The IF signal produced at line 42 is supplied to the correlator 44 together with a reference PN bit sequence to produce a correlation pulse. The correlation pulse from a Barker sync word is provided to the bit timing loop 48 and matched filter 46 to produce timing signals for operation of the decoder 50. The filtered signal sample is provided to the decoder 50 where the redundant bit information is summed and then subjected to a hard decision. The data produced by the hard decision is then transmitted through line 60 to the microprocessor 58.

Figure 5:
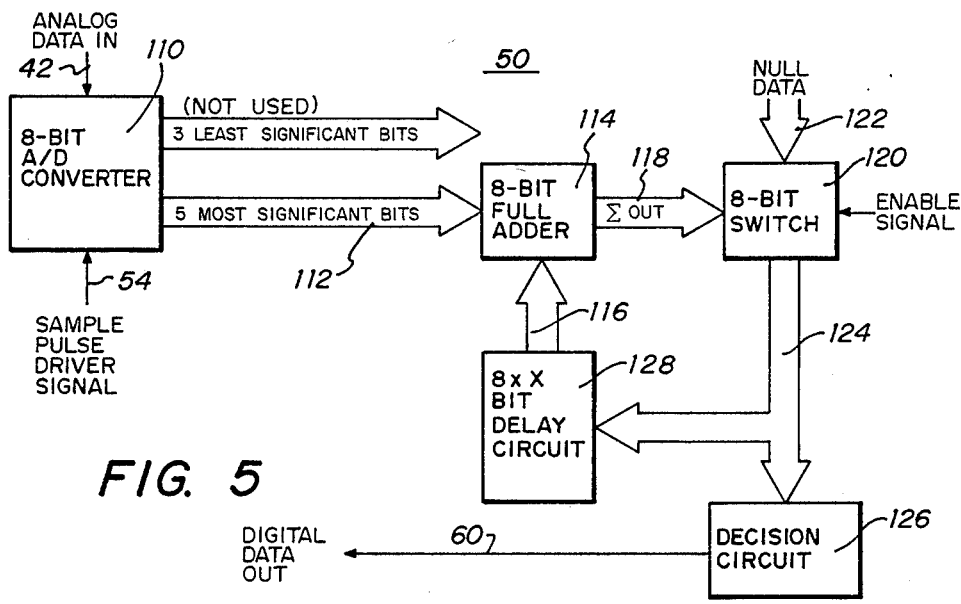
FIG. 5 is a block diagram of a decoder/interleaver for processing redundantly coded digital data.

Reference is now made to FIG. 5 for a functional description of the redundant deinterleaver/decoder 50 of the present invention. The digitally modulated analog data comprising the received signal is transmitted through line 42 to an 8-bit analog to digital converter 110. The sample pulse driver signal is received through line 54 from the matched filter 46 for timing the operation of the converter 110. The analog received signal is sampled to produce an 8 bit digital quantity corresponding to the amplitude of the received sample at the time of sampling. For the embodiment described herein the three least significant bits are not utilized. The five most significant bits are transmitted through a channel 112 to an 8 bit full adder 114. This is accomplished as a parallel shift. The digital quantity received through channel 112 is summed with the digital information received through a channel 116 to produce a summation quantity which is transmitted through channel 118. The summation quantity is provided as an input to the 8 bit switch 120. A null data set is transmitted to the switch 120 through a channel 122.

The digitized information comprising the output of switch 120 is transmitted through a channel 124 to both a decision circuit 126 and a delay circuit 128. The decision circuit 126 produces the digital data output on line 60.

The delay circuit 128 in this embodiment is 8 bits wide and X bits in length. As noted above X is the interleave length of the redundant data.

In further reference to FIG. 5, the analog data signal is sampled during each signal period by analog to digital converter 110 to produce a digital word corresponding to the amplitude of the signal sample. Each digital word representing a signal sample is transmitted to adder 114 where it is added to a quantity received at that time from channel 116. The summation quantity produced by the addition process is transmitted through channel 118 to switch 120. Switch 120 operates to transmit the summation quantity to channel 124 for each signal period of the block of data except after the last bit has been processed. At the start of each block of data an enable signal, described below, activates the switch 120 to route null (zero) data into channel 124. Thus, at the start of each cycle of recursive data there will be a zero value stored in circuit 128 for each bit of the data block.

As each bit within a data block is received the bit is digitized and the value is added to the previously stored value in the corresponding slot. When one complete block of data has been received, there will be a cumulative sum for each repeated bit. Each sum will be the summation of M samples.

Eight bits are provided in the adder 114 to allow for the peak values which can occur for the five bit wide samples.

The decision circuit 126 examines the final summation produced for each bit to make the hard decision concerning the state of that bit. In the ideal case, the summation for a "one" is 1111 1111 and the summation quantity for a zero is "0000 0000". But, due to the presence of noise, the summation for a "one" will generally be less than maximum while the summation for a "zero" will generally be more than the minimum. The decision circuit 126 includes a threshold value for comparison to establish the state of the information bit. The threshold in this embodiment is set at 1000 0000. Any summation quantity in excess of this threshold is designated to be a "one" while any quantity less than this is designated to be a "zero". The maximum value for "zero" is then 0111 1111 while the minimum value for the summation of all "ones" is 1000 0000. It can therefore be seen that the most significant bit, the furthermost left bit, represents the decoded state of the information bit. The decision process is not carried out until all of the repetitive blocks for a unit of data have been examined and the samples therefrom included within the summation totals. The bit produced in the decision process is then transmitted through line 60 as the digital data output.

Figure 6:
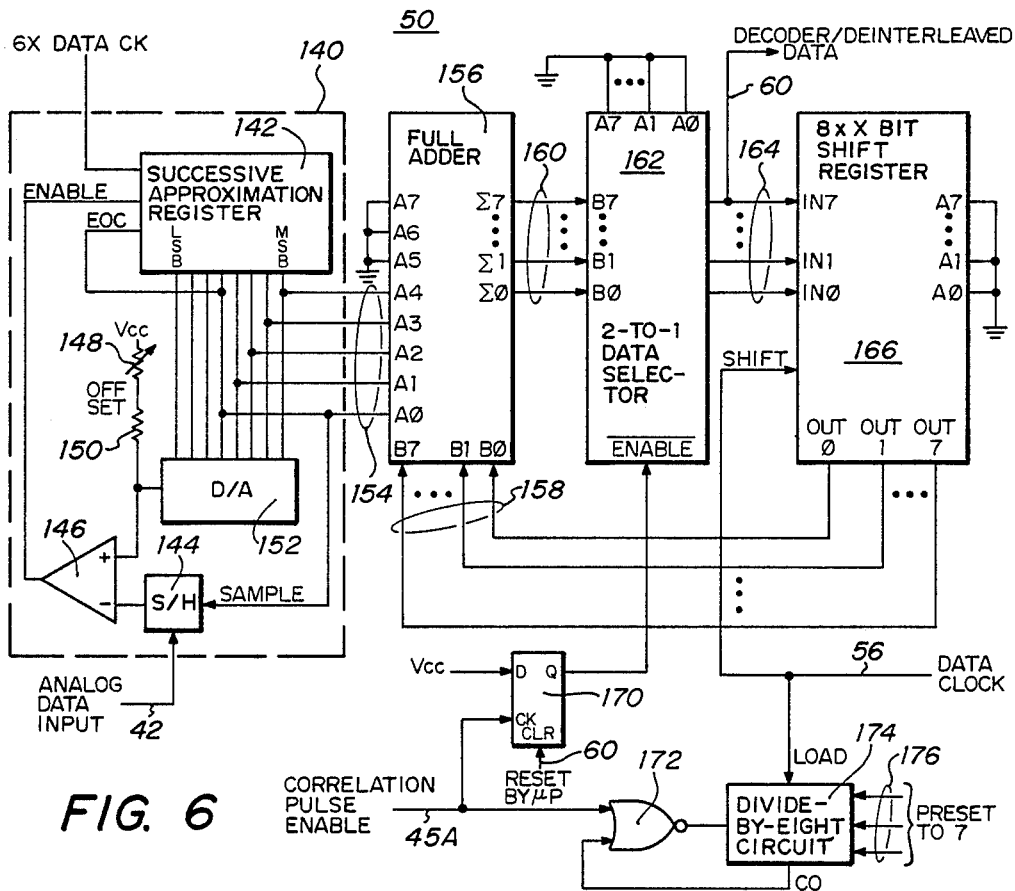
FIG. 6 is a detailed schematic diagram of a decoder/deinterleaver for processing redundantly coded digital data.

A detailed schematic diagram of the decoder/deinterleaver 50 of the present invention is described in reference to FIG. 6. An analog to digital converter 140 is shown within the dashed lines. Converter 140 is a typical integrated circuit component available in the industry. Analog to digital converter 140 includes a successive approximation register 142 which receives a clock signal at a rate of six times that of the data clock on line 56. The analog data input is provided to a sample and hold circuit 144 which is also included as a portion of converter 140. The sampled input signal is provided to the inverting input of an operational amplifier 146, the output of which is transmitted to register 142. An offset adjustment for amplifier 146 is provided by the series combination of a potentiometer 148 and a resistor 150 which is connected to the noninverting input of amplifier 146. The remaining terminal of potentiometer 148 is connected to the voltage source Vcc. Potentiometer 148 can thus be adjusted to determine the offset which is applied to the incoming analog data signal.

Through a successive approximation procedure the bit values for the five most significant bits are produced at the output of register 142 by operation in conjunction with an analog to digital converter subcircuit 152. As noted above only the five most significant bits of the available eight bits are utilized in this embodiment.

The digitized sample values in register 142 are transmitted in parallel through lines 154 to a full adder 156. The second input to adder 156 is provided by a parallel shift of bits through lines 158. The output from adder 156 is also provided as a parallel shift and is transmitted through lines 160.

A two-to-one data selector 162 is connected to lines 160 from adder 56 and has input lines A0 through A7 grounded to represent a null signal. Data selector 162 routes either the inputs received on line 160 or the null inputs to a group of output lines 164 which transfer the signal therein to an 8×X bit shift register 166. X in this example is 96. The eight output terminals of register 166 are connected to lines 158 to transfer the output signal from register 166 to the input terminals of adder 156. The lines 158 provide a recirculation path for accumulating the total quantity for each bit.

In a preferred embodiment of the present invention as described above, the analog data signal is modulated with a superimposed pseudorandom sequence known as a Barker sync word which can be decoded to produce a correlation pulse. This correlation pulse can then be utilized to provide the timing necessary to decode the analog input signal. The correlation pulse, produced by the fast acquisition portion of correlator 44, is utilized as an enable function and is input through line 45A to the clock terminal of a D-type flip-flop 170. The correlation pulse is also input to the first input of a NOR gate 172. The D terminal of flip-flop 70 is connected to the voltage source Vcc while the clear terminal is connected to the output of microprocessor 58. The Q output of flip-flop 170 provides the enable pulse to data selector 162.

The second input of gate 172 is connected to the "CO" output of a divide-by-eight circuit 174. A set of lines 176 are connected to the input of circuit 174 to preset the circuit to a value of seven by the microprocessor 58 after each block of data is decoded. A data clock signal is provided through line 56 as an input to circuit 174 and is also provided as a shift input to register 166.

Commercial components for use in the embodiment shown in FIG. 6 are listed below.

| Component | Manufacturer | Part No. |
| --- | --- | --- |
| A/D converter 140 | TRW | TDC1014J |
| full adder 156 | Texas Instruments | SN74LS283J |
| data selector 162 | Texas Instruments | SN74LS399J |
| shift register 166 | American Micro Devices | AM2896C |
| divide-by-eight 174 | Texas Instruments | SN74LS164J |

The circuit shown in FIG. 6 functions essentially in the same manner as the functional block diagram described in reference to FIG. 5. The input signal is sampled during each bit period to produce a digital quantitative value which is transferred to the adder 156. The sample value is added to the accumulated value for that particular bit position and the total is transferred to the selector circuit 162 for routing to shift register 166. Register 166 serves as a storage medium to hold the accumulated sums for one particular block period. The accumulated sums are transferred through lines 158 back to the second input of adder 156 so that the sums for each bit period can be accumulated over one block. At the end of one cycle of information blocks the most significant bit of the output of the data selector circuit 162 is taken as the bit state value for the corresponding bit position. At the end of a cycle, the enable terminal of data selector circuit 162 is activated to insert null values in each of the bit positions. This insures that at the start of a new cycle each bit position will be set to zero to start accumulating data for the next block of information.

The correlation pulse entering flip-flop 170 and NOR gate 172 indicates exact timing of a newly received signal and is used to initialize control of the overall circuit. When the correlation pulse occurs, flip-flop 170 is set to enable the full adder 156 to transfer the summation data therein into register 166. Thus, flip-flop 170 starts the decoding operation which continues until the microprocessor 58 reset pulse is received by flip-flop 170. The function of the microprocessor 58 is to gather decoded data and to indicate when message decoding is complete. Shift register 166 does not shift incoming data until operation of divide-of-eight circuit 174 begins. Divide-by-eight 174 is a counter which counts from 7 through 15 (8 pulses) and enables decisions to be made when a count of 15 occurs. Divide-by-eight circuit 174 is initially loaded to a value of 7 by passage of the correlation pulse through NOR gate 172. Thereafter, a carry out, "CO", passes through NOR gate 172 to perform the initializing function of "preset to 7".

The method and apparatus for the decoder/deinterleaver described above provides a demodulator for recursively transmitted digital information. Each bit is examined to produce a soft decision and a summation of the soft decisions is produced. The summation quantity thus produced is subjected to a hard decision to determine the state of the information bit. Such a system is relatively insensitive to pulse interference which can distort individual bits but only infrequently can destroy a sufficient number of bits to cause the incorrect decoding of a sequence of repeated bits.

Although one embodiment of the invention has been illustrated in the accompanying drawings and described in the foregoing detailed description, it will be understood that the invention is not limited to the embodiment disclosed, but is capable of numerous rearrangements, modifications, and substitutions without departing from the scope of the invention.

We claim:

1. A method for decoding a digital signal data stream having interleaved redundantly coded information bits, comprising the steps of:

(a) sampling each coded information bit in a character string in the data stream to produce at least two quantitative samples for each sampled coded information bit;

(b) transferring said quantitative samples for the sampled bits to an adder;

(c) summing in said adder said quantitative samples for the sampled bits with cumulative quantitative samples for each coded information bit in the character string to produce summation samples for said character string;

(d) transferring said summation samples to a storage means to form said cumulative quantitative samples for said character string;

(e) repeating steps (a)–(d) for redundant occurrences of said character string in the data stream; and (f) selecting a most significant digit of each of the summation samples to be a determined state of the redundantly coded information bits.

2. The method for decoding a digital signal data stream as described in claim 1 further including the step of:

(g) resetting said summation samples to zero after the state of each of said coded information bits has been determined.

3. Apparatus for decoding a digitally encoded signal data stream having interleaved redundantly coded information bits, comprising:

means for sampling the coded information bits in a character string in the data stream to produce at least two quantitative samples representing each coded information bit;

means for summing said quantitative samples for each of the coded information bits with cumulative quantitative samples for each of said coded information bits to produce summation samples for said character string;

means for storing said summation samples for said character string;

means for transferring said summation samples to said means for storing; and means for selecting a most significant digit of each of said summation samples to comprise a state of the coded information bit corresponding to the summation samples.

4. Apparatus as recited in claim 3 including means for resetting said summation samples to zero after a last occurrence of the character string has been sampled, the resulting quantitative samples included in the summation samples and the state of the coded information bits determined.

* * * * *